United States Patent
Yoshii et al.

(10) Patent No.: US 6,894,316 B2
(45) Date of Patent: May 17, 2005

(54) EL DEVICE SEALING PLATE, AND MULTIPLE SEALING PLATE-PRODUCING MOTHER GLASS SUBSTRATE

(75) Inventors: Tetsuro Yoshii, Tokyo (JP); Hiroshi Nishikawa, Tokyo (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 31 days.

(21) Appl. No.: 10/455,973

(22) Filed: Jun. 5, 2003

(65) Prior Publication Data

US 2003/0227024 A1 Dec. 11, 2003

(30) Foreign Application Priority Data

Jun. 6, 2002 (JP) .......................... 2002-165617

(51) Int. Cl.[7] .......................... H01L 33/00; H01J 63/04
(52) U.S. Cl. .......................... 257/98; 257/100; 313/512
(58) Field of Search .................... 257/98–100; 313/500, 313/505, 512

(56) References Cited

U.S. PATENT DOCUMENTS

| | | | |
|---|---|---|---|
| 6,646,284 B2 | * | 11/2003 | Yamazaki et al. ............ 257/40 |
| 6,706,425 B2 | * | 3/2004 | Ishii et al. ................... 428/690 |
| 2002/0145128 A1 | * | 10/2002 | Sakaguchi ............... 252/181.3 |

* cited by examiner

*Primary Examiner*—Minh-Loan Tran
(74) *Attorney, Agent, or Firm*—Cohen, Pontani, Lieberman & Pavane

(57) ABSTRACT

There is provided an EL device sealing plate for which a drop in transparency is suppressed. An organic EL device 200 is comprised of a substrate 10, an organic EL layered body 20 that is formed on the substrate 10, and a sealing plate 30 that has been formed into a recessed shape so as to cover the organic EL layered body 20. The sealing plate 30 exhibits a parallel transmittance of not less than 91.5% and a haze of not more than 0.5%.

7 Claims, 4 Drawing Sheets

EL DEVICE SEALING PLATE, AND MULTIPLE SEALING PLATE-PRODUCING MOTHER GLASS SUBSTRATE

BACKGROUND OF THE INVENTION

1. Field of the Invention

The present invention relates to an EL (electroluminescent) device sealing plate, and a multiple sealing plate-producing mother glass substrate for producing a plurality of the EL device sealing plates, and in particular to an EL device sealing plate that has been processed into a recessed shape so as to cover an EL layered body formed on a substrate, and a multiple sealing plate-producing mother glass substrate for producing a plurality of the EL device sealing plates.

2. Description of the Related Art

There are passive and active EL devices.

The passive EL device has a simple matrix structure. In this simple matrix structure, first electrodes are disposed on a substrate, an EL layered body containing a light-emitting layer and then back electrodes as second electrodes are built up in this order on an upper surface of the first electrodes, and then sealing is carried out to keep out moisture and oxygen using a sealing plate that has been processed into a recessed shape so as to cover the EL layered body. With such a passive EL device, by controlling the shapes of the first electrodes, the light-emitting layer and the back electrodes, the light-emitting layer can be made to emit light selectively in accordance with the shape of the light-emitting layer; for example, by making the first electrodes and the back electrodes be mutually orthogonal stripes, matrix display can be carried out.

Moreover, the active EL device has an active matrix structure. In this active matrix structure, as with the structure of a TFT liquid crystal device, a thin film transistor circuit or a diode is formed on a substrate for each pixel, an EL layered body containing a light-emitting layer is built up on upper surfaces of the thin film transistor circuits or diodes, and then sealing is carried out to keep out moisture and oxygen using a sealing plate that has been processed into a recessed shape so as to cover the EL layered body. With such an active EL device, high-speed changing display can be carried out due to the high-speed switching ability of the thin film transistor circuits or diodes formed pixel by pixel, and hence such an active EL device is suited to display of moving images; it is thus thought that in the future, EL display apparatuses will primarily use active EL devices.

Furthermore, there are EL devices in which a bottom emission structure is adopted, and EL devices in which a top emission structure is adopted.

With an EL device in which a bottom emission structure is adopted, transparent members are used from the light-emitting layer toward and as far as the substrate, whereby the light emitted from the light-emitting layer is made to exit from the substrate side. With an EL device in which a top emission structure is adopted, transparent members are used from the light-emitting layer toward and as far as the sealing plate, whereby the light emitted from the light-emitting layer is made to exit from the sealing plate side.

However, with an active EL device, the thin film transistor circuits or diodes are not transparent, and hence if a bottom emission structure is adopted, then there will be parts where the light emitted from the light-emitting layer is blocked by the non-transparent film transistor circuits or diodes; the aperture ratio will thus be low, and hence the brightness relative to the inputted electrical power will be low.

Moreover, with an EL device in which a top emission structure is adopted, to make the aperture ratio high, and hence make the brightness relative to the inputted electrical power high, the sealing plate is required to have high transparency.

A glass material having high transparency is thus preferably used for the sealing plate. However, it is difficult to process a plate-shaped glass material into a recessed shape to obtain the sealing plate, and moreover the transparency is prone to dropping during this processing.

SUMMARY OF THE INVENTION

It is an object of the present invention to provide an EL device sealing plate for which a drop in transparency is suppressed, and a multiple sealing plate-producing mother glass substrate for producing a plurality of the EL device sealing plates.

To attain the above object, in a first aspect of the present invention, there is provided an EL device sealing plate that has been processed into a recessed shape so as to cover an EL layered body that contains a light-emitting layer and has been formed on a substrate, wherein the EL device sealing plate exhibits a parallel transmittance of not less than 91.5% and a haze of not more than 0.5% for light emitted from the light-emitting layer.

According to this construction, the parallel transmittance for light emitted from the light-emitting layer is not less than 91.5%, and the haze is not more than 0.5%, and hence an EL device sealing plate for which a drop in transparency is suppressed can be provided.

Preferably, the EL device sealing plate is for use in an EL device having a top emission structure. As a result, the light from the light-emitting layer can be made to exit from the EL device sealing plate side.

Also preferably, the EL device sealing plate has been processed into the recessed shape using a wet etching method. As a result, the recessed shape can be made to have a flat surface, and hence the effect of suppressing a drop in transparency can be realized more reliably.

To attain the above object, in a second aspect of the present invention, there is provided an EL device sealing plate that has been processed into a recessed shape so as to cover an EL layered body that contains a light-emitting layer and has been formed on a substrate, wherein the EL device sealing plate exhibits an angle of visibility greater than 120° for light emitted from the light-emitting layer.

According to this construction, the angle of visibility of light emitted from the light-emitting layer is greater than 120°, and hence an EL device sealing plate for which a drop in transparency is suppressed can be provided.

Preferably, the EL device sealing plate is for use in an EL device having a top emission structure. As a result, the light from the light-emitting layer can be made to exit from the EL device sealing plate side.

Also preferably, the EL device sealing plate has been processed into the recessed shape using a wet etching method. As a result, the recessed shape can be made to have a flat surface, and hence the effect of suppressing a drop in transparency can be realized more reliably.

To attain the above object, in a third aspect of the present invention, there is provided a multiple sealing plate-producing mother glass substrate comprising a plurality of glass EL device sealing plates according to the first or second aspect the glass EL device sealing plates being formed substantially in a matrix shape.

According to this construction, a plurality of glass EL device sealing plates according to the first or second aspect are formed substantially in a matrix shape, and hence glass EL device sealing plates for which a drop in transparency is suppressed can be provided.

The above and other objects, features, and advantages of the invention will become more apparent from the following detailed description taken in conjunction with the accompanying drawings.

DETAILED DESCRIPTION OF THE PREFERRED EMBODIMENTS

The present inventors carried out assiduous studies to attain the above object, and as a result discovered that if an EL device sealing plate that has been processed into a recessed shape so as to cover an EL layered body that contains a light-emitting layer and has been formed on a substrate exhibits a parallel transmittance of not less than 91.5% and a haze of not more than 0.5% for light emitted from the light-emitting layer, then an EL device sealing plate for which a drop in transparency is suppressed can be provided.

Moreover, the present inventors discovered that if an EL device sealing plate that has been processed into a recessed shape so as to cover an EL layered body that contains a light-emitting layer and has been formed on a substrate exhibits an angle of visibility greater than 120° for light emitted from the light-emitting layer, then an EL device sealing plate for which a drop in transparency is suppressed can be provided.

Furthermore, the present inventors discovered that if a wet etching method is used when manufacturing an EL device sealing plate as described above, then a drop in transparency during the manufacture can be suppressed.

The present invention was accomplished based on the above findings.

Embodiments of the present invention will now be described in detail, with reference to the drawings.

Figure 1:
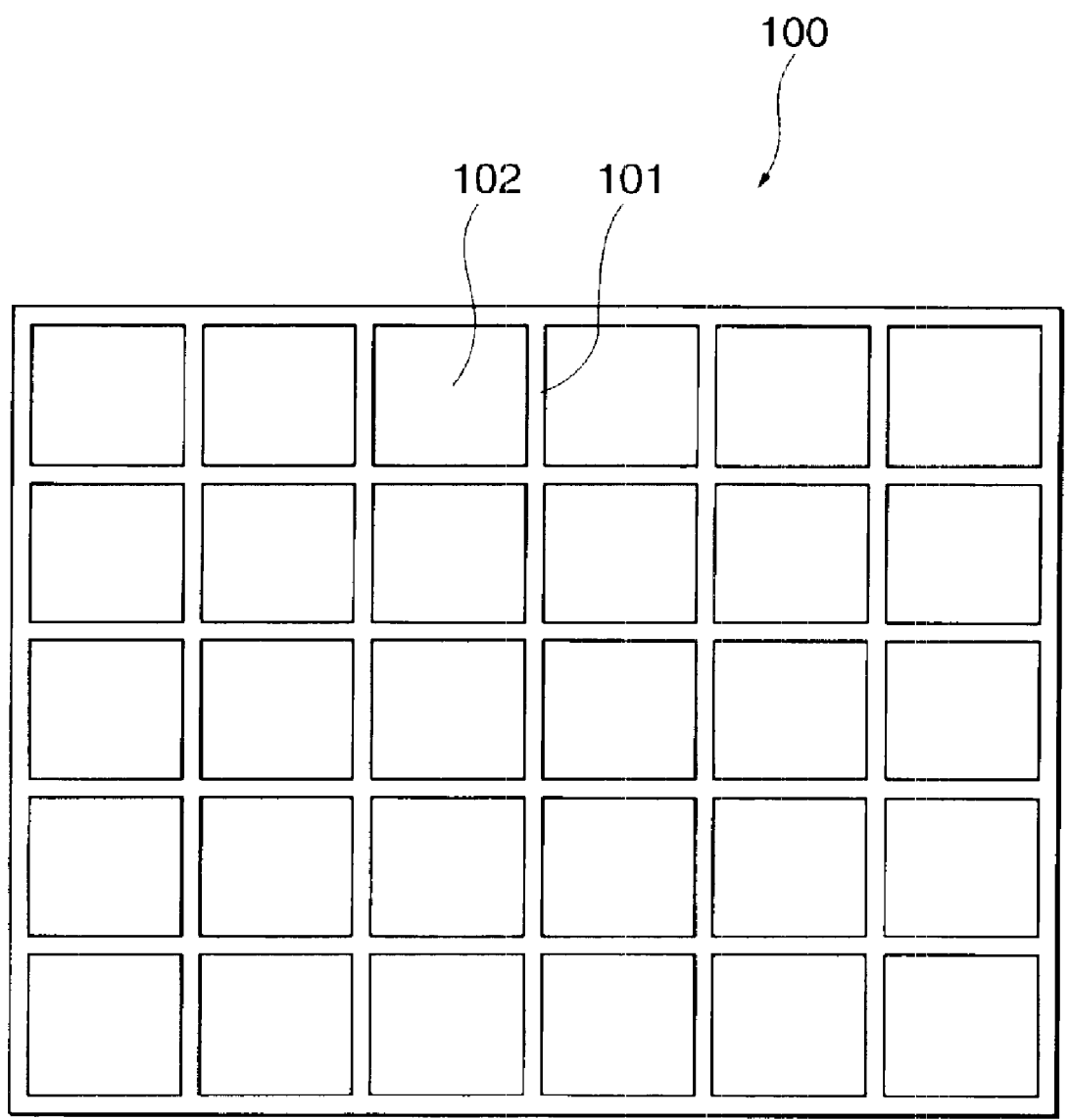
FIG. 1 is a top plan view of a multiple sealing plate-producing mother glass substrate in which EL device sealing plates are formed substantially in a matrix shape, according to an embodiment of the present invention.

FIG. 1 is a top plan view of a multiple sealing plate-producing mother glass substrate in which EL device sealing plates are formed substantially in a matrix shape, according to an embodiment of the present invention.

In FIG. 1, a multiple sealing plate-producing mother glass substrate 100 having a length of 30 cm and a width of 40 cm has glass EL device sealing plates formed therein in a 5×6 matrix shape.

A method of forming such EL device sealing plates in such a 5×6 matrix shape in a starting material glass plate is to remove predetermined parts of the starting material glass plate to form recesses using a sandblasting method, an etching method such as wet etching, or the like.

For example, in the case of wet etching, first an alkali-free glass starting material glass plate is masked using a tape-like resist of width 2.0 mm such that parts of the starting material glass plate that remain exposed form a 5×6 matrix shape. The masked starting material glass plate is then immersed for approximately 10 to 180 minutes in an etching solution comprised of 5 to 50 mass % hydrofluoric acid containing a suitable amount of at least one inorganic acid selected from the group consisting of sulfuric acid, hydrochloric acid, nitric acid, and phosphoric acid, whereby glass is removed from the starting material glass plate to form recessed parts 102 at the exposed parts, leaving behind projecting parts 101 at the masked parts. The starting material glass plate is next washed thoroughly with pure water, and then the resist is stripped off. Note that a surfactant may be added to the etching solution as appropriate. Furthermore, it is preferable for the etching solution to contain one or more organic acid(s) and/or base(s) selected from the group consisting of carboxylic acids, dicarboxylic acids, amines, and amino acids as appropriate.

Because predetermined parts of the starting material glass plate are removed to form recessed parts using a wet etching method as described above, a surface of a base part of the recessed part 102 of each EL device sealing plate can reliably be made to be flat, and hence the strength of the EL device sealing plate to external pressure can be increased.

Next, the multiple sealing plate-producing mother glass substrate 100 in which the recessed parts 102 have been formed in a 5×6 matrix shape as described above is cut along the projecting parts 101 that partition the recessed parts 102 from one another. As a result, 30 (5×6) EL device sealing plates can be obtained.

In the multiple sealing plate-producing mother glass substrate 100 described above, the arrangement of the EL device sealing plates is made to be a matrix shape; however, there is no limitation thereto, but rather any arrangement suitable for producing a plurality of EL device sealing plates from a single mother glass substrate may be adopted.

Moreover, the width of the resist is not limited to being 2.0 mm, but rather may be made to be any width insofar as the width of peripheral projecting parts of each of the EL device sealing plates obtained is not less than the thickness at these peripheral projecting parts, and may even be made to be a high value of approximately 1 cm to secure margins for the cutting out of the EL device sealing plates.

According to the multiple sealing plate-producing mother glass substrate 100 shown in FIG. 1, a plurality of EL device sealing plates can be obtained by separation through cutting. Moreover, the strength of the EL device sealing plates to external pressure can be increased. Furthermore, processing of the EL device sealing plates one at a time can be eliminated, and hence the productivity of the manufacture of the EL device sealing plates can be improved.

Figure 2:
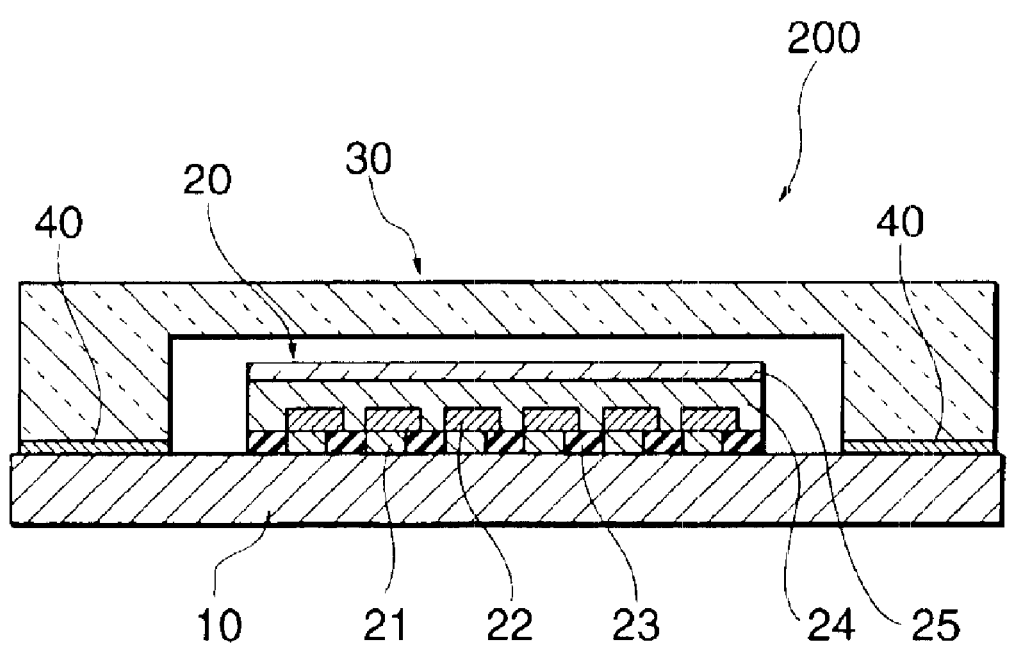
FIG. 2 is a sectional view of an EL device having an EL device sealing plate according to the present embodiment.

FIG. 2 is a sectional view of an EL device having an EL device sealing plate according to the present embodiment.

In FIG. 2, a top emission type organic EL device 200 has a top emission structure and is comprised of a plate-shaped transparent alkali-free glass substrate 10 having sides (i.e. a length and width) of 7.0 cm and a thickness of 1.0 mm, an organic EL layered body 20 that is formed on the substrate 10, and an alkali-free glass sealing plate 30 that is bonded onto the substrate 10 using an adhesive 40 so as to cover the organic EL layered body 20. The adhesive 40 is made of an ultraviolet-curing type epoxy resin or the like. The sealing plate 30 is manufactured by subjecting a plate-shaped transparent alkali-free glass starting material glass plate having sides of 5.0 cm and a thickness of 0.70 mm to wet etching, thus forming a recessed part such that the thickness at a base part is 0.43 mm and the width of peripheral projecting parts is at least 0.70 mm.

The organic EL layered body 20 is comprised of thin film transistor (TFT) parts 21 formed on the substrate 10, lower electrodes 22, an inter-layer insulating film 23 that electrically insulates the TFT parts 21 and the lower electrodes 22 from one another, an organic EL film 24, and an upper transparent electrode 25.

Figure 3:
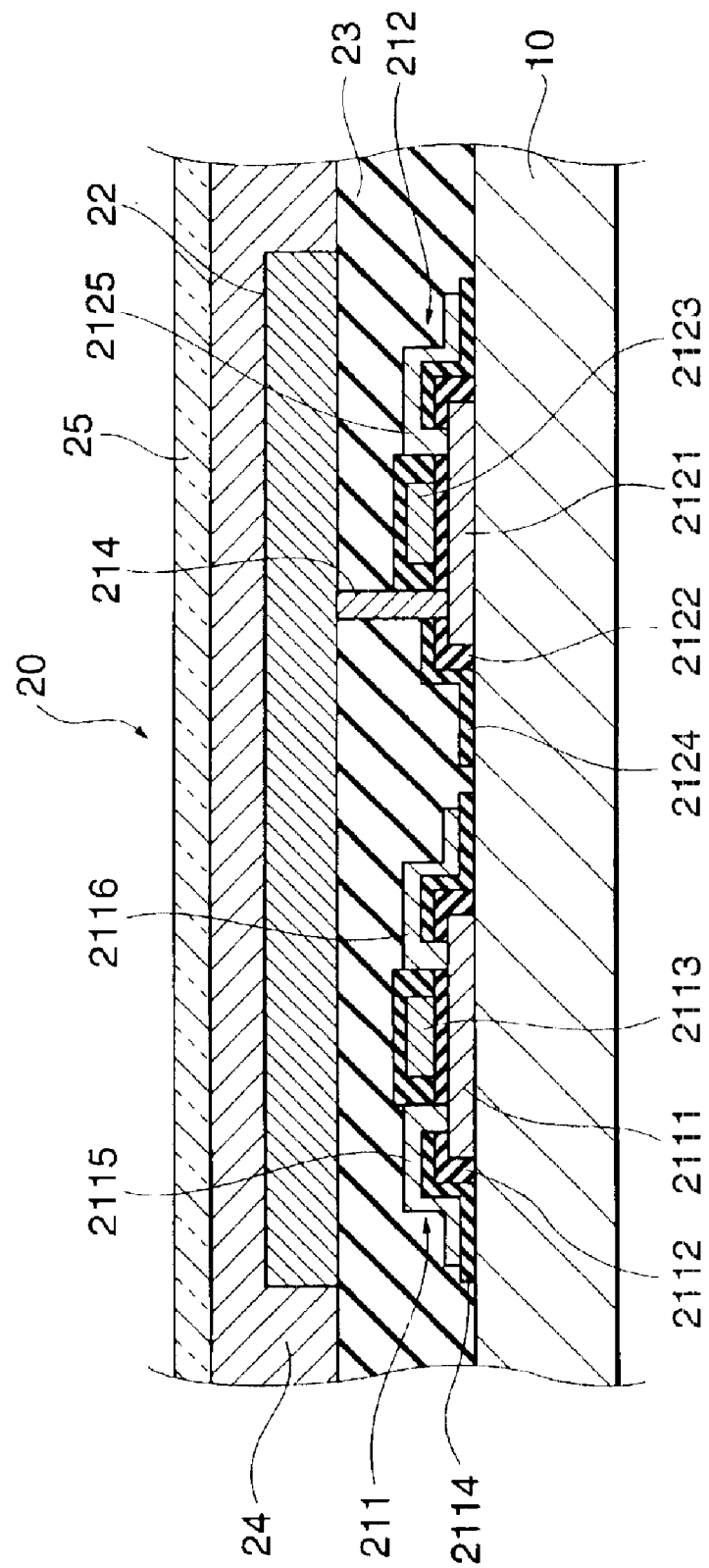
FIG. 3 is an enlarged sectional view of part of an organic EL layered body 20 appearing in FIG. 2.

FIG. 3 is an enlarged sectional view of part of the organic EL layered body 20 appearing in FIG. 2.

As shown in FIG. 3, the TFT parts 21 of the organic EL layered body 20 in FIG. 2 are comprised of controlling TFTs 211 and driving TFTs 212. The controlling TFTs 211 and the driving TFTs 212 are arranged alternately, and the inter-layer insulating film 23 is built up thereon, such that the inter-layer insulating film 23 covers the TFTs 211 and 212 and is also present between the TFTs 211 and 212.

The controlling TFTs 211 and the driving TFTs 212 have capacitors (not shown), and signal lines, scanning lines and common electrode lines that are connected to the capacitors, and moreover each driving TFT 212 has a joining line 214 that is connected to the corresponding lower electrode 22.

Each controlling TFT 211 is comprised of a semiconductor layer 2111 that is formed on the substrate 10, a gate insulator film 2112 that is disposed on the semiconductor layer 2111, a gate electrode 2113 that is disposed on an upper surface of the gate insulator film 2112 above the semiconductor layer 2111, an insulating layer 2114 that is disposed on an upper surface of the gate insulator film 2112 in a fashion being separated into a source side and a drain side, and a source electrode 2115 and a drain electrode 2116 that are disposed on an upper surface of the insulating layer 2114.

Each driving TFT 212 is comprised of a semiconductor layer 2121, a gate insulator film 2122, a gate electrode 2123, an insulating layer 2124, and a source electrode 2125; the arrangement of these components is basically the same as the arrangement of the corresponding components in the controlling TFT 211, but in addition the semiconductor layer 2121 and the lower electrode 22 are connected together by the previously mentioned joining line 214.

An alkali-free glass starting material glass plate is used as the starting material of the sealing plate 30 in the present embodiment, but any glass that is an insulator, has low moisture permeability, and has high transparency can be used for the sealing plate 30. The transparency of the sealing plate 30, which is inevitably lower than the transparency of the starting material glass plate, is preferably such that the parallel transmittance of light emitted from a light-emitting layer of an EL device in which the sealing plate 30 is used is not less than 91.5%, and the haze is not more than 0.5%. Furthermore, the transparency of the sealing plate 30 is also preferably such that the angle of visibility is greater than 120° but less than the angle of visibility for the starting material glass plate.

Because a recessed part is formed in the sealing plate 30, the sealing plate 30 can be prevented from contacting the organic EL layered body 20. The etching depth of the recessed part in the sealing plate 30 is varied as appropriate in accordance with the type and thickness of the organic EL layered body 20, and the transparency, which depends on the thickness at a flat part of the sealing plate 30 after the processing.

In the embodiment described above, an alkali-free glass sealing plate 30 is manufactured from a starting material glass plate by forming a recessed part using a wet etching method; possible methods of processing such a glass sealing plate into a recessed shape include not only etching methods such as wet etching, but also a pressing method in which the starting material glass plate itself is bent, and a sandblasting method.

Figure 4:
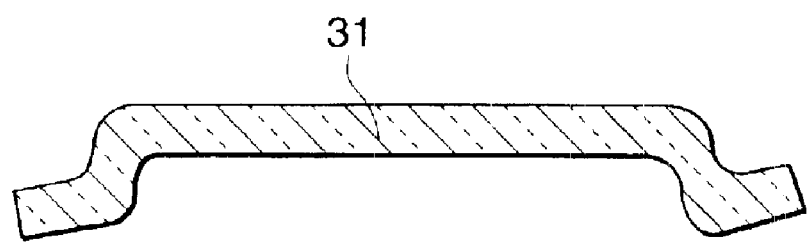
FIG. 4 is a sectional view of a sealing plate 31 of Comparative Example 2.
Figure 5:
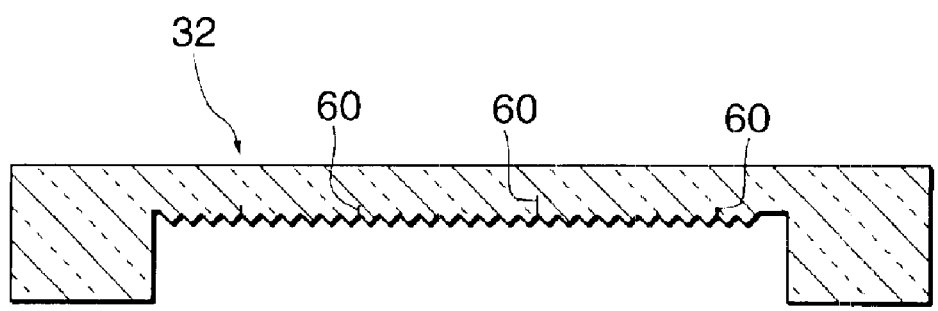
FIG. 5 is a sectional view of a sealing plate 32 of Comparative Example 3.

As shown in FIG. 4, in the case of a sealing plate 31 that has been processed into a recessed shape using a pressing method, parts of the sealing plate 31 that contact the substrate of an EL device in which the sealing plate 31 is used, i.e. parts that are bonded to the substrate, have a low degree of flatness, and hence moisture and oxygen are liable to penetrate into the EL device via these bonded parts, and moreover the transparency of the sealing plate 31 is reduced due to the bending. Moreover, as shown in FIG. 5, in the case of a sealing plate 32 in which a recessed part has been formed using a sandblasting method, a large number of minute cracks 60 that are inherent in the sandblasting method arise in the surface of the base part of the sealing plate 32, and hence the transparency of the flat part of the sealing plate 32 drops. Regarding these points, in the case of the sealing plate 30 in which the recessed part is formed using the etching method, the degree of flatness of the bonded parts is high, and minute cracks 60 do not arise in the flat part, and hence a drop in transparency when manufacturing the sealing plate 30 by processing into the recessed shape can be suppressed.

Moreover, possible etching methods include not only wet etching, but also dry etching. With dry etching, the processing is carried out on one sealing plate 30 at a time, and hence, although the etching can be carried out precisely, productivity is poor. On the other hand, with wet etching, if the components of the etching solution and the etching temperature are suitably selected, then it becomes possible to carry out batch processing in which a plurality of sealing plates 30 are etched simultaneously, and hence productivity is good.

The etching solution used in the wet etching method is preferably 5 to 50 mass % hydrofluoric acid to which has been added a suitable amount of at least one inorganic acid selected from the group consisting of sulfuric acid, hydrochloric acid, nitric acid, and phosphoric acid. As a result, the etching ability can be increased. Moreover, a surfactant may be added to the etching solution as appropriate.

Furthermore, a suitable amount of one or more organic acid(s) and/or base(s) selected from the group consisting of carboxylic acids, dicarboxylic acids, amines, and amino acids is added to the etching solution. As a result, the transparency of the sealing plate 30 can be improved, i.e. the parallel transmittance of light emitted from a light-emitting layer of an EL device in which the sealing plate 30 is used can be made to be not less than 91.5%, and the haze can be made to be not more than 0.5%, and moreover the angle of visibility can be made to be greater than 120° but less than the angle of visibility for the starting material glass plate.

The components of the etching solution and the concentrations thereof are varied as appropriate in accordance with the temperature of the etching solution, the composition of the glass to be etched, and so on. Moreover, when carrying out the etching, it is also effective to shake the glass substrate being etched, and/or apply low-power ultrasound. As a result, the etching solution can be made to be a uniform solution. Furthermore, when carrying out the etching, after taking the glass substrate out from the etching solution, it is effective to temporarily immerse the glass substrate in water, or at least one inorganic acid selected from the group consisting of sulfuric acid, hydrochloric acid, nitric acid and phosphoric acid, or one or more organic acid(s) and/or base(s) selected from the group consisting of carboxylic acids, dicarboxylic acids, amines and amino acids. As a result, the etching can be carried out uniformly.

According to the sealing plate 30 of the present embodiment, the transparency thereof, which is inevitably lower than the transparency of the starting material glass plate, is such that the parallel transmittance of light emitted from a light-emitting layer of an EL device in which the sealing plate 30 is used is not less than 91.5%, and the haze is not more than 0.5%, and hence a sealing plate 30 for which a drop in the transparency is suppressed can be provided. Moreover, if the transparency of the sealing plate 30 is such that the angle of visibility is greater than 120° but less than the angle of visibility for the starting material glass plate, then the parallel transmittance of light emitted from a light-emitting layer of an EL device in which the sealing plate 30 is used is not less than 91.5%, and the haze is not more than 0.5%, and hence a sealing plate 30 for which a drop in the transparency is suppressed can be provided.

In the embodiment described above, the sealing plate 30 is made to be an alkali-free glass sealing plate having formed therein a recessed part such that the thickness at a base part is 0.43 mm and the width of peripheral projecting parts is at least 0.70 mm. However, in accordance with the structure of the top emission type organic EL device 200, instead of an alkali-free glass, the sealing plate 30 may be made of a low-alkali glass, a quartz glass, a soda-lime glass or the like. Moreover, the thickness at the base part of the sealing plate 30 is preferably in a range of 0.3 to 1.1 mm. This is because if this thickness is less than 0.3 mm, then the strength of the base part of the sealing plate 30 will be too low, whereas at a thickness of 1.1 mm the strength of the base part of the sealing plate 30 will be sufficiently high and hence increasing the thickness beyond this is unnecessary and will merely result in a drop in the transparency. The width of the peripheral projecting parts of the sealing plate 30 is preferably not less than the thickness at the peripheral projecting parts, more preferably not less than 1.1 mm. If the width of the peripheral projecting parts is less than the thickness at the peripheral projecting parts, then the strength of the peripheral projecting parts will be too low, whereas if the width of the peripheral projecting parts is not less than the thickness at the peripheral projecting parts, then the strength of the peripheral projecting parts will be sufficiently high to the extent that it will be possible to maintain the original strength of the glass. Moreover, if the width of the peripheral projecting parts is not less than 0.7 mm, then a sufficient bonding area for the adhesive 40 can be secured.

In the present embodiment, the EL film is made to be an organic EL layered body 20 having an active structure. However, a passive structure may be adopted. Moreover, the EL film may be made to be an inorganic EL film. In this case, the inorganic EL film is constituted from a transparent conductive film, an insulating layer, a light-emitting layer, an insulating layer or an electron barrier layer, a light-emitting layer, and a transparent current limiting layer, laminated in this order from the transparent conductive film side.

EXAMPLES

Examples of the present invention will now be described.

Sealing plate test pieces of Examples 1 to 5 and Comparative Examples 1 to 3 each having a recessed part formed therein using a recessed shape processing method as indicated in Table 1 were prepared from alkali-free glass starting material glass plates. In the case that the recessed shape processing method was wet etching, the components in the etching solution and the concentrations thereof were varied as shown in Table 1 (Examples 1 to 5 and Comparative Example 1). As the alkali-free glass starting material glass plate, an NA-35 (trade name, made by NH Techno-Glass Co., Ltd.) glass substrate having sides of 5.0 cm and a thickness of 0.70 mm was used.

The wet etching was carried out as follows. First, an etching solution having a composition as shown in Table 1 was prepared. The NA-35 glass substrate was then masked by covering peripheral parts of an upper surface thereof with an acid-resistant tape (resist) of width 5.0 mm and all the other surfaces thereof with an acid-resistant tape (resist) of a suitable width. The masked NA-35 glass substrate was then immersed for 60 minutes in the etching solution, which was maintained at 25° C., whereby a recessed part having sides of 4.0 cm and a depth of 270 μm was formed in the NA-35 glass substrate. The NA-35 glass substrate was then washed thoroughly with pure water, and then the acid-resistant tapes was stripped off, whereby a sealing plate 30 (FIG. 2) was obtained.

In the case that the recessed shape processing method was pressing (Comparative Example 2), the pressing was carried out as follows. An NA-35 glass substrate having a thickness of 0.50 mm was pressed with a carbon mold while being heated to a temperature close to the working temperature, thus forming a recessed part of depth 200 μm in the glass substrate (FIG. 4). The thickness of the glass at the pressed part of the resulting sealing plate 31 was made to be 0.30 mm, which is thinner than the thickness of the glass at the etched base part in the sealing plate 30 (0.43 mm (=0.70 mm—0.27 mm)). The carbon mold used was one that had been made to have minute undulations thereon to prevent seizure, and hence the sealing plate 31 of Comparative Example 2 had corresponding minute undulations transferred thereon from the carbon mold.

In the case that the recessed shape processing method was sandblasting (Comparative Example 3), the sandblasting was carried out as follows. An NA-35 glass substrate having a thickness of 0.70 mm was processed into a recessed shape by sandblasting such that the thickness of the glass at the sandblasted part became 0.30 mm, which is thinner than the thickness of the glass at the etched base part in the sealing plate 30 (0.43 mm), whereby a sealing plate 32 of Comparative Example 3 was prepared (FIG. 5). Minute cracks 60 and so on inherent in sandblasting arose in the sealing plate 32 of Comparative Example 3.

An investigation was carried out into the transparency of each of the sealing plate test pieces prepared as described above. Specifically, the parallel transmittance (%) and the haze (%) were measured using a turbidimeter (an "NDH 2000" turbidimeter made by Nippon Denshoku Industries Co., Ltd.). The light emission intensity of the turbidimeter was made to be substantially the same as the intensity of light emitted from the light-emitting layer of a top emission type EL device. The parallel transmittance of an unprocessed NA-35 glass substrate was 91.70%, and the haze was 0.09%.

The measurement results are shown in Table 1.

TABLE 1

| | | Examples | | | | | Comparative Examples | | |
|---|---|---|---|---|---|---|---|---|---|
| Recessed Shape Processing Method | | 1 | 2 | 3 Wet Etching | 4 | 5 | 1 Wet Etching | 2 Pressing | 3 Sandblasting |
| Etching Solution Components and Concentrations thereof [mass %] | Hydrofluoric acid | 10 | 20 | 15 | 10 | 12 | 20 | | |
| | Sulfuric acid | — | 3.0 | — | — | 2.0 | 3.0 | | |
| | Hydrochloric acid | 5.0 | — | — | 3.0 | — | — | | |
| | Nitric acid | — | — | 4.0 | — | — | — | | |
| | Ammonium fluoride | — | — | — | — | 3.0 | — | | |
| | Succinic acid | — | 2.0 | — | — | — | — | | |
| | Propionic acid | — | — | 0.5 | — | 2.5 | — | | |
| | Tartaric acid | — | — | — | — | 20 | — | | |
| | Gluconic acid | 30 | — | — | — | — | — | | |
| | Urea | — | 1.0 | — | — | — | — | | |
| | Ethylamine | — | — | — | — | 1.5 | — | | |
| | Glycine | — | — | 1.0 | — | — | — | | |
| | Alanine | — | — | — | 3.0 | — | — | | |
| | Lysine | — | — | — | — | 5.0 | — | | |
| Parallel Transmittance [%] | | 91.50 | 91.65 | 91.63 | 91.54 | 91.55 | 91.34 | 52.70 | 48.70 |
| Haze [%] | | 0.30 | 0.19 | 0.21 | 0.24 | 0.23 | 0.51 | 40.76 | 43.70 |
| Angle of Visibility [°] | | 133 | 150 | 145 | 139 | 141 | 120 | | |

From Table 1, it can be seen that if wet etching is used as the recessed shape processing method, and a suitable amount of one or more organic acid(s) and/or base(s) selected from the group consisting of carboxylic acids, dicarboxylic acids, amines, and amino acids is added to the etching solution, then the parallel transmittance can be made to be not less than 91.5% and the haze can be made to be not more than 0.5% as measured using a turbidimeter.

Moreover, in the case that wet etching was used as the recessed shape processing method, the angle of visibility (°) was further measured by visually observing 7-point size black characters arranged on a white background sheet disposed on the light-emitting layer side of the sealing plate 30. The angle of visibility measurement results are also shown in Table 1. The angle of visibility was defined as the maximum angle (°) in the vertical or horizontal direction relative to the angle of visibility in a head-on direction being set to 0°, at which the black characters can be properly visually observed. The angle of visibility was 160° for an unprocessed NA-35 glass substrate.

From Table 1, it can be seen that if a suitable amount of one or more organic acid(s) and/or base(s) selected from the group consisting of carboxylic acids, dicarboxylic acids, amines, and amino acids is added to the etching solution, then the angle of visibility can be made to be greater than 120° but less than 160°. Moreover, it can be seen that if the angle of visibility is greater than 120° but less than 160°, then the parallel transmittance can be made to be not less than 91.5% and the haze can be made to be not more than 0.5% as measured using a turbidimeter.

In the examples described above, the sealing plate 30 test pieces were each manufactured individually. However, in the case of using the wet etching method, a plurality of sealing plates 30 may instead be manufactured simultaneously as shown in FIG. 1, whereby productivity can be improved.

What is claimed is:

1. An EL device sealing plate that has been processed into a recessed shape so as to cover an EL layered body that contains a light-emitting layer and has been formed on a substrate;

wherein the EL device sealing plate exhibits a parallel transmittance of not less than 91.5% and a haze of not more than 0.5% for light emitted from the light-emitting layer.

2. An EL device sealing plate as claimed in claim 1, wherein the EL device sealing plate is for use in an EL device having a top emission structure.

3. An EL device sealing plate as claimed in claim 1, wherein the EL device sealing plate has been processed into the recessed shape using a wet etching method.

4. A multiple sealing plate-producing mother glass substrate, comprising a plurality of glass EL device sealing plates as claimed in claim 1, said glass EL device sealing plates being formed substantially in a matrix shape.

5. An EL device sealing plate that has been processed into a recessed shape so as to cover an EL layered body that contains a light-emitting layer and has been formed on a substrate;

wherein, for light emitted from the light-emitting layer, the EL device sealing plate exhibits an angle of visibility greater than 120° and less than an angle of visibility of a starting material for the substrate.

6. An EL device sealing plate as claimed in claim 5, wherein the EL device sealing plate is for use in an EL device having a top emission structure.

7. An EL device sealing plate as claimed in claim 5, wherein the EL device sealing plate has been processed into the recessed shape using a wet etching method.

* * * * *